(12) United States Patent
Zhao et al.

(10) Patent No.: US 6,917,212 B2
(45) Date of Patent: Jul. 12, 2005

(54) TEST FIXTURE FOR PRINTED CIRCUIT BOARD ASSEMBLY

(75) Inventors: Yue Qing Zhao, Shenzhen (CN); Lin Yan, Shenzhen (CN); Ga Lei Hu, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 263 days.

(21) Appl. No.: 10/310,340

(22) Filed: Dec. 4, 2002

(65) Prior Publication Data

US 2004/0075456 A1 Apr. 22, 2004

(30) Foreign Application Priority Data

Oct. 18, 2002 (TW) ...................................... 91216627 U

(51) Int. Cl.[7] ............................................. G01R 31/02
(52) U.S. Cl. ...................... 324/755; 324/758; 324/761
(58) Field of Search ................................ 324/754–755, 324/757–758, 761, 158.1; 439/482, 824

(56) References Cited

U.S. PATENT DOCUMENTS

| | | | |
|---|---|---|---|
| 5,572,144 A | * | 11/1996 | Davidson et al. ........... 324/755 |
| 6,025,729 A | * | 2/2000 | Van Loan et al. .......... 324/755 |
| 6,118,292 A | * | 9/2000 | Antonello et al. .......... 324/758 |
| 6,628,130 B2 | * | 9/2003 | Williams et al. ............ 324/755 |

FOREIGN PATENT DOCUMENTS

| | | |
|---|---|---|
| TW | 370197 | 9/1999 |

* cited by examiner

Primary Examiner—Minh N. Tang
(74) Attorney, Agent, or Firm—Wei Te Chung

(57) ABSTRACT

A test fixture for a printed circuit board (PCB) assembly (6) includes lower and upper units (2, 4). The PCB assembly includes a PCB (60) defining two spaced positioning holes (62), and a reinforcing plate (64) defining a plurality of openings (65). The lower unit includes a fixed base (20) and an adjustable support plate (21) defining a plurality of through holes (27). The upper unit includes a movable base (40), and a test plate (41) having two rows of identical columns (44) for engaging with the support plate. The support plate includes first and second positioning members (24, 25) supporting the PCB assembly. Support posts (272) are arranged on the fixed base for supporting a bottom of the PCB. The test plate includes two positioning pins (45) engaging in the positioning holes of the PCB, and a plurality of pressing posts (46) for pressing a top of the PCB.

20 Claims, 4 Drawing Sheets

TEST FIXTURE FOR PRINTED CIRCUIT BOARD ASSEMBLY

BACKGROUND OF THE INVENTION

1. Field of the Invention

The present invention relates to electronic test equipment, and more particularly to a test fixture for testing a printed circuit board assembly.

2. Related Art

Automatic test systems have generally been found to be effective for use in testing printed circuit board assemblies of various types. Such systems are particularly useful when testing large quantities of identical printed circuit board assemblies, such as computer motherboards. Most currently available automatic test systems comprise test computers having software which enables them to be used for testing various portions of printed circuit board assemblies, as well as for testing various specific electrical components which are attached on the printed circuit board assemblies. In order to electrically interconnect automatic test systems to printed circuit board assemblies, it has generally been necessary to use test fixtures that are adapted to receive specific printed circuit boards having predefined configurations.

A typical conventional test fixture includes a fixed board for positioning the printed circuit board assembly, and a movable board commonly arranged above the fixed board. The movable board is for carrying an array of test probes and/or cards to electrically interconnect automatic test systems to the printed circuit board assembly. It is important that the fixed board, which positions the printed circuit board assembly to be tested, be parallel or substantially parallel to the movable board throughout the testing procedure. If the movable board and the fixed board are not parallel to each other during testing, the test probes or test cards will not be accurately connected with the printed circuit board assembly or components attached on the printed circuit board assembly. As a result, the testing is prone to error or may even fail. Furthermore, the printed circuit board assembly and/or its attached components are liable to sustain damage.

Taiwan Patent No. 370197 discloses a motherboard test fixture comprising a fixed board and a movable board. The fixed board comprises a plurality of positioning pins engaging in positioning holes of the motherboard to be tested. The movable board carries a plurality of test cards connecting with the motherboard during testing. The movable board further comprises a plurality of spring loaded-pressing pins pressing a component side of the motherboard.

The above-described motherboard test fixture is suitable for conventional motherboards consisting of a printed circuit board and a plurality of electrical components mounted thereon. However, many recently developed motherboards have a highly complicated circuitry pattern and more electrical components mounted thereon. This requires the motherboard to be mechanically strong enough to hold the components securely. Therefore, a reinforcing plate is mounted to a solder side of the motherboard. The reinforcing plate functions only as a strengthening device shield. Therefore, the reinforcing plate is generally manufactured and installed with relatively low precision, to reduce manufacturing costs and save time.

However, this imprecision gives rise to a problem in the testing procedure. Because the reinforcing plate is not precisely mounted, it is not positioned parallel to the motherboard. As a result, it is problematic to position the motherboard parallel to the movable board of the conventional test fixture.

In spite of the above mentioned problems, the reinforcing plate is still widely used in the motherboard field. This is because many manufacturers consider that the benefits of the imprecisely made reinforcing plate outweigh the above mentioned problems. However, there remains a clear need for a test fixture that enables a motherboard having a reinforcing plate to be precisely positioned thereon.

SUMMARY OF THE INVENTION

Accordingly, an object of the present invention is to provide a test fixture for precisely positioning any of a wide variety of printed circuit board assemblies thereon.

To achieve the above-mentioned object, a test fixture for a printed circuit board assembly in accordance with a preferred embodiment of the present invention comprises a lower unit and an upper unit. The printed circuit board assembly comprises a printed circuit board defining a pair of spaced positioning holes and having a socket, and a reinforcing plate mounted below a solder side of the printed circuit board and defining a plurality of openings therein. The lower unit comprises a fixed base and a support plate adjustably mounted on the fixed base. The support plate comprises: four first positioning members at four corners thereof respectively, for supporting four corners of the printed circuit board assembly; and a pair of spaced second positioning members at opposite sides thereof respectively engaging with opposite sides of the printed circuit board assembly. A plurality of through holes is defined in the support plate. The fixed base comprises a plurality of support posts extending through the through holes of the support plate and the openings of the reinforcing plate and supporting a bottom of the printed circuit board. The upper unit comprises a movable base and a test plate mounted to an underside of the movable base. The test plate comprises a pair of positioning pins engaging in the positioning holes of the printed circuit board, a plurality of pressing posts pressing a top of the printed circuit board, two rows of columns depending opposite sides thereof respectively, and a test card engaging in the socket of printed circuit board for testing. The printed circuit board having the reinforcing plate is thereby precisely positioned between the lower unit and the upper unit.

Other objects, advantages and novel features of the present invention will be drawn from the following detailed description of a preferred embodiment of the present invention with attached drawings, in which:

DESCRIPTION OF THE PREFERRED EMBODIMENT

The present invention will be described in its preferred embodiment, and in conjunction with a printed circuit board assembly such as a motherboard.

Figure 1:
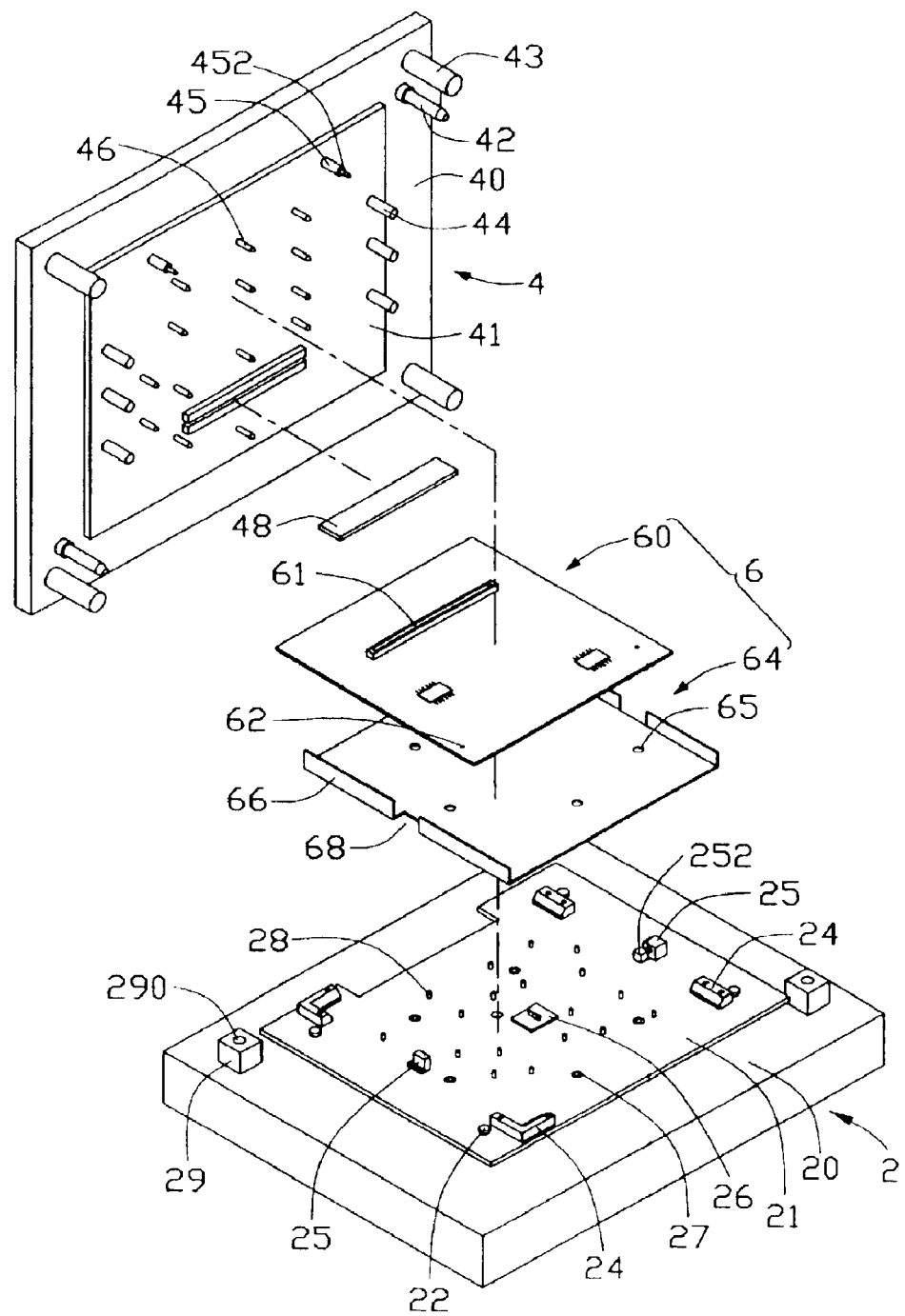
FIG. 1 is an exploded isometric view of a printed circuit board assembly test fixture in accordance with a preferred embodiment of the present invention, together with a printed circuit board assembly.
Figure 2:
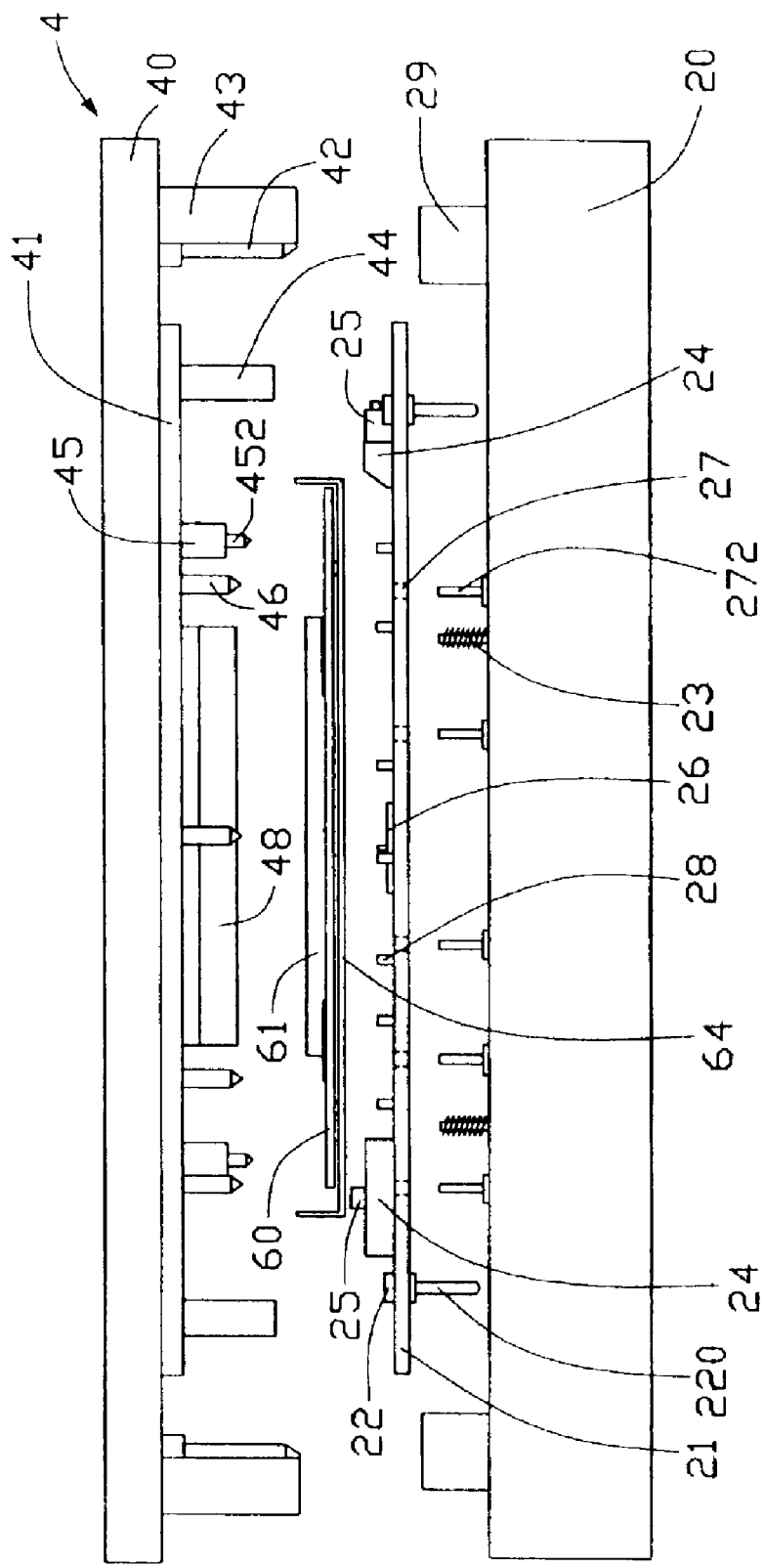
FIG. 2 is a side elevation view of the components of FIG. 1 partly assembled.

FIGS. 1 and 2 show a printed circuit board assembly test fixture in accordance with the preferred embodiment of the present invention, together with a printed circuit board assembly 6. The test fixture comprises a lower unit 2 and an upper unit 4. The upper unit 4 is movably connected to the lower unit 2 with a plurality of telescopic links (not shown).

The printed circuit board assembly 6 comprises a printed circuit board 60, and a reinforcing plate 64 mounted below but spaced a small distance from a solder side of the printed circuit board 60. The printed circuit board 60 comprises a socket 61, and defines a pair of spaced positioning holes 62 therein. The reinforcing plate 64 is made of conductive material, and defines a plurality of openings 65 therein. A pair of flanges 66 extends upwardly from opposite edges of the reinforcing plate 64 respectively. A cutout 68 is defined in a middle of each flange 66.

The lower unit 2 is used to support the printed circuit board assembly 6. The lower unit 2 comprises a fixed base 20, and a support plate 21 adjustably mounted on the fixed base 20. A plurality of spring pins 23 projects from the fixed base 20, for resiliently supporting the support plate 21. Four guiding studs 22 are mounted to four corners of the support plate 21 respectively. As better shown in FIG. 2, each guiding stud 22 comprises a shank portion 220 depending from the support plate 21. The fixed base 20 defines a plurality of holes (not shown) for receiving the shank portions 220 of the guiding studs 22 respectively. When the support plate 21 is moved downwardly, the support plate 21 overcomes resistance of the spring pins 23, and moves downwardly along the shank portions 220 of the guiding studs 22.

The support plate 21 comprises four first positioning members 24 at the four corners thereof respectively, and a pair of spaced second positioning members 25 corresponding to the cutouts 68 of the flanges 66 of the reinforcing plate 60 respectively, for preventing relative horizontal movement between the support plate 21 and the printed circuit board assembly 6. Each first positioning member 24 comprises an inclined plane for facilitating supporting a corresponding corner of the printed circuit board assembly 6. A retractable small block 252 projects inwardly from one of the second positioning members 25, for resiliently engaging with the printed circuit board assembly 6. A position detector 26 is mounted on a middle of the support plate 21, for detecting whether the printed circuit board assembly 6 is disposed in a correct position. A plurality of through holes 27 is defined in the support plate 21, corresponding to the openings 65 of the reinforcing plate 64 respectively. A plurality of protrusions 28 extends upwardly from the support plate 21, for supporting a bottom of the reinforcing plate 64.

The fixed base 20 comprises a plurality of support posts 272, corresponding to the through holes 27 of the support plate 21 and the openings 65 of the reinforcing plate 64, for preventing relative horizontal movement between the fixed base 20 and the support plate 21. A pair of projections 29 extends upwardly from diagonally opposite corners of the fixed base 20 respectively. A guiding hole 290 is vertically defined in each projection 29.

The upper unit 4 comprises a movable base 40, and a test plate 41 mounted to an underside of the movable base 40.

The movable base 40 comprises a pair of guiding shafts 42 corresponding to the guiding holes 290 of the projections 29 of the fired base 20, for preventing relative horizontal movement between the fixed base 20 and the movable base 40. Four pillars 43 depend from four corners of the movable base 40 respectively. When the upper unit 4 is moved toward the lower unit 2, the pillars 43 contact the fixed base 20 and stop further movement. When the upper unit 4 is moved away from the lower unit 2, the telescopic links between the lower unit 2 and the upper unit 4 stop further movement.

The test plate 41 is designed for testing of a desired printed circuit board. The test plate 41 is replaceable by other test plates, for testing of other different types of printed circuit boards as desired. The test plate 41 comprises two rows of identical columns 44 depending from opposite sides thereof respectively, a pair of positioning pins 45 corresponding to the positioning holes 62 of the printed circuit board 60, for preventing relative horizontal movement between the upper unit 4 and the printed circuit board assembly 6, and a plurality of pressing posts 46 for pressing the printed circuit board 60. The columns 44 are for pressing the support plate 21 of the lower unit 2 to position the support plate 21 parallel to the test plate 41, and are for preventing relative horizontal movement between the support plate 21 and the upper unit. The positioning pins 45 are electrically connected with an external display circuit (not shown) through which an operator can ascertain a state of the positioning pins 45 during testing. Each positioning pin 45 comprises a spring loaded head portion 452, for extending through the positioning holes 62 of the printed circuit board 60 to position the printed circuit board assembly 6. After passing through the positioning holes 62, the head portions 452 can reach the reinforcing plate 64 and close the external display circuit. The test plate 41 further comprises a test card 48, corresponding to the socket 61 of the printed circuit board 60.

Figure 3:
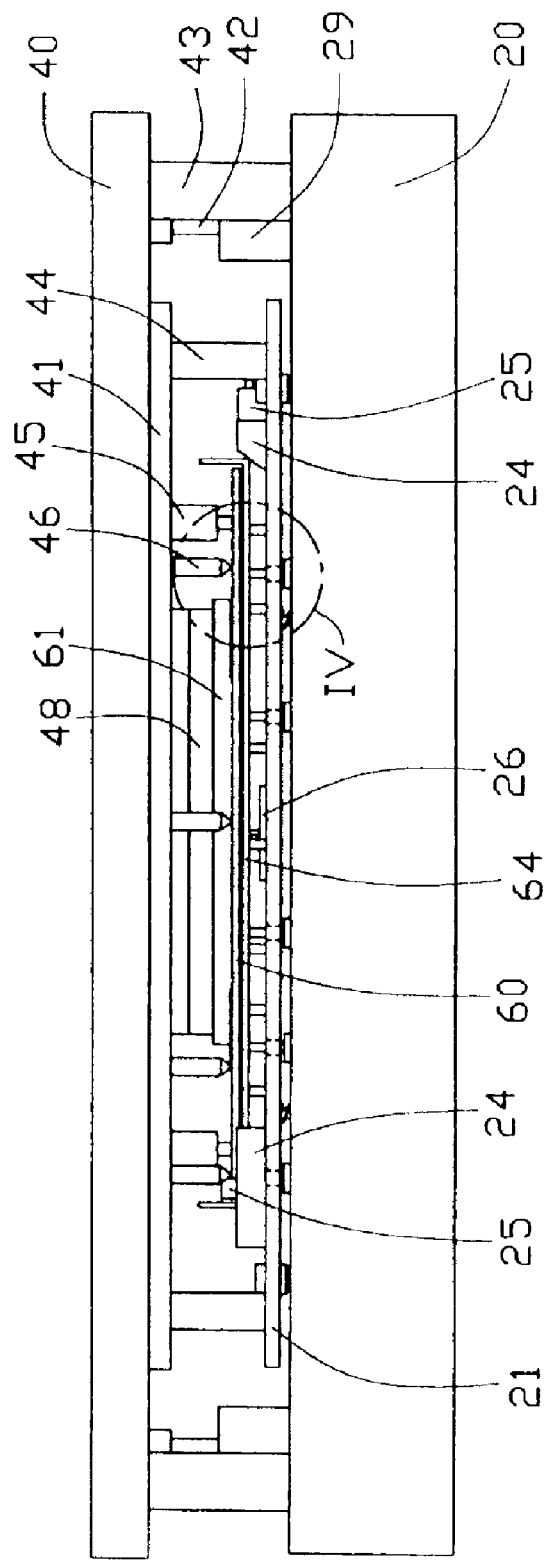
FIG. 3 is similar to FIG. 2, but showing the components fully assembled.
Figure 4:
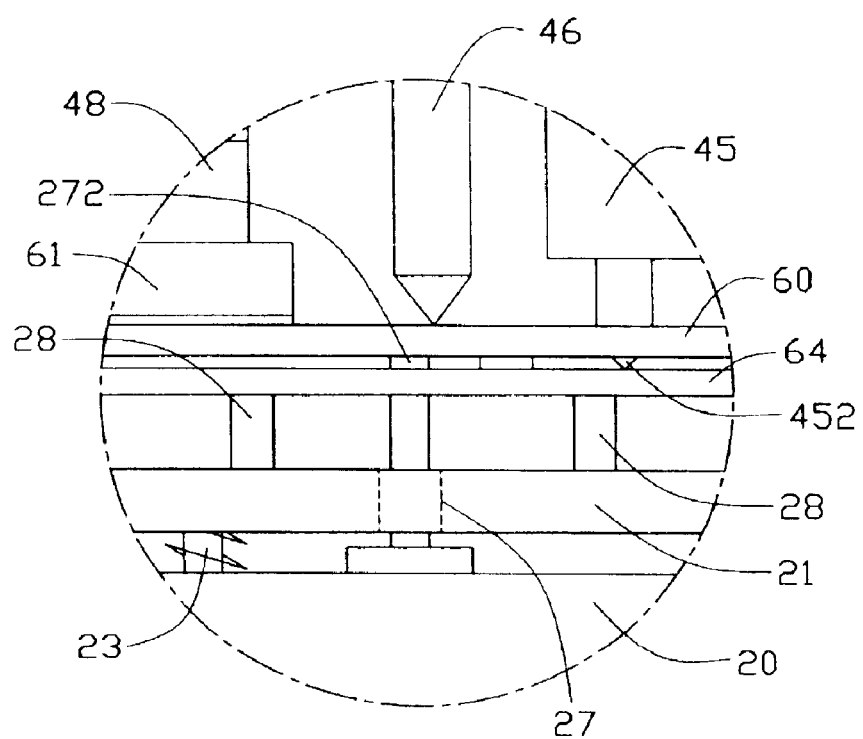
FIG. 4 is an enlarged view of an encircled portion IV of FIG. 3.

Referring to FIGS. 3 and 4, to test the printed circuit board assembly 6, the printed circuit board assembly 6 is placed on the support plate 21 of the lower unit 2. Four corners of the reinforcing plate 64 are respectively supported on the inclined planes of the first positioning members 24. The second positioning member 25 at one side of the support plate 21 abuts against the printed circuit board 60 at the cutout 68 of the flange 66 of the reinforcing plate 64. The retractable block 252 of the other second positioning member 25 located at an opposite side of the support plate 21 resiliently urges the reinforcing plate 64. The bottom of the reinforcing plate 64 is supported by the protrusions 28 of the support plate 21. The support posts 272 of the fixed base 20 of the lower unit 2 are aligned with the though holes 27 of the support plate 21 and the openings 65 of the reinforcing plate 64. Simultaneously, the position detector 26 of the support plate 21 detects that the printed circuit board assembly 6 is in the correct position.

Then the upper unit 4 is moved downwardly toward the printed circuit board 60 supported on the support plate 21 of the lower unit 2. The guiding shafts 42 of the test plate 41 are inserted into the guiding holes 290 of the projections 29 of the fixed base 20 respectively, to ensure accurate movement of the upper unit 4.

The upper unit 4 continues moving downwardly, and the test card 48 is inserted into the corresponding socket 61 of the printed circuit board 60. The pressing posts 46 of the test plate 41 urge a top of the printed circuit board 60. The head portions 452 of the positioning pins 45 are extended through the positioning holes 62 of the printed circuit board 60 and make resilient contact with the reinforcing plate 64. Since the reinforcing plate 64 is conductive, the external circuit connected to the positioning pins 45 becomes closed. This state of the positioning pins 45 is displayed for the operator. The columns 44 of the test plate 41 subsequently contact respective opposite sides of the support plate 21.

The upper unit 4 continues moving down. The columns 44 of the test plate 41 drive the support plate 21 to move downwardly along the shank portions 220 of the guiding studs 22. As a result, the support posts 272 are extended through the through holes 27 of the support plate 21 and the openings 65 of the reinforcing plate 64 to support a bottom of the printed circuit board 60. Simultaneously, the pillars 43 of the movable base 40 abut the fixed base 20 to stop further movement of the upper unit 4. The printed circuit board assembly 6 is thus positioned on the printed circuit board assembly test fixture and ready to be tested.

In the printed circuit board assembly test fixture of the present invention, the positioning pins 45 of the test plate 41 are extended through the positioning holes 62 of the printed circuit board 60. Thus, the printed circuit board 60 is prevented from moving relative to the test fixture in directions that are parallel to the test plate 41. In addition, the top of the printed circuit board 60 is pressed by the pressing posts 46 of the test plate 41 of the upper unit 4, and the bottom of the printed circuit board 60 is supported by the support posts 272 of the fixed base 20 of the lower unit 2. Thus, the printed circuit board 60 is prevented from moving relative to the test fixture in a direction that is perpendicular to the test plate 41.

Furthermore, the support plate 21 is adjustably mounted on the fixed base 20 and engaged by the identical columns 44. Thus, the support plate 21 is urged to be parallel to the test plate 41. This ensures that the printed circuit board assembly 6 supported on the support plate 21 is parallel to the test plate 41. Therefore, the risk of poor contact between the test card 48 and the socket 61 is minimized. Moreover, the risk of damage to the printed circuit board assembly 6 is minimized. The support plate 21 may further form holes to allow the columns 44 to be retained therein alternately.

It is understood that the invention may be embodied in other forms without departing from the spirit thereof Thus, the present examples and embodiments are to be considered in all respects as illustrative and not restrictive, and the invention is not to be limited to the details given herein.

What is claimed is:

1. A test fixture for a printed circuit board assembly, the printed circuit board assembly comprising a printed circuit board and a reinforcing plate mounted below the printed circuit board, the printed circuit board comprising at least one socket and defining a plurality of positioning holes, the reinforcing plate defining a plurality of openings, the test fixture comprising:
 a lower unit adapted for supporting the printed circuit board assembly thereon, and comprising a fixed base and a support plate adjustably mounted on said fixed base, said support plate comprising a plurality of positioning members at a periphery thereof for supporting the printed circuit board assembly thereon, and defining a plurality of through holes corresponding to the openings of said reinforcing plate, said fixed base comprising a plurality of support posts being extendable through the through holes of said support plate and the openings of said reinforcing plate to support a bottom of the printed circuit board; and
 an upper unit movably connected to said lower unit, and comprising a movable base and a test plate mounted on said movable base, the test plate comprising at lease one test card adapted for engaging in the at least one socket of said printed circuit board for testing, a plurality of positioning pins being extendable through the positioning holes of the printed circuit board, a plurality of columns engaging with the support plate of the lower unit, and a plurality of pressing posts for pressing a top of the printed circuit board.

2. The test fixture as described in claim 1, wherein the support plate comprises a plurality of guiding studs each having a shank portion at corners thereof, and the fixed base defines a plurality of holes for receiving the shank portions of the guiding studs respectively.

3. The test fixture as described in claim 2, wherein the fixed base comprises a plurality of spring pins resiliently supporting said lower unit.

4. The test fixture as described in claim 1, wherein the positioning members of the support plate comprise four first positioning members at four corners of said support plate, and each of the first positioning members comprises an inclined plane adapted for supporting a corresponding corner of said printed circuit board assembly.

5. The test fixture as described in claim 4, wherein the positioning members further comprise a pair of second positioning members at opposite sides of the support plate adapted for urging opposite sides of said printed circuit board assembly, and one of the second positioning members comprises a retractable block resiliently urging a corresponding side of the printed circuit board assembly.

6. The test fixture as described in claim 1, wherein the support plate comprises a plurality of protrusions adapted for supporting said reinforcing plate.

7. The test fixture as described in claim 1, wherein the support plate comprises a position detector mounted on a middle thereof and adapted for detecting whether the printed circuit board assembly is disposed in a correct position.

8. The test fixture as described in claim 1, wherein the positioning pins of the upper unit are electrically connected with an external circuit, and each of the positioning pins comprises a spring loaded head portion adapted for extending through a corresponding positioning hole of the printed circuit board and contacting said reinforcing plate, so that said external circuit becomes closed and a state of the positioning pins is displayed for an operator.

9. The test fixture as described in claim 1, wherein the movable base comprises a plurality of guiding shafts at respective corners thereof, the fixed base comprises a plurality of projections, and each of the projections defines a guiding hole for movably receiving a corresponding guiding shaft.

10. The test fixture as described in claim 1, wherein the movable base comprises a plurality of pillars at respective corners thereof for contacting the fixed base and stopping further movement when the upper unit is moved toward the lower unit.

11. The test fixture as described in claim 1, wherein the upper unit is connected to the lower unit with a plurality of telescopic links.

12. A testing fixture assembly comprising:
 upper and lower units;
 the lower unit including a fixed base and a support plate adjustably mounted upon the fixed base;
 first alignment means between the support plate and the fixed base for preventing relative horizontal movement therebetween;
 resilient means for providing upward spring force against the support plate;
 a printed circuit board assembly disposed upon the support plate;
 second alignment means between the support plate and the printed circuit board assembly for preventing relative horizontal movement therebetween;
 the upper unit including a movable base located above the printed circuit board assembly, and a test plate attached thereunder;

third alignment means between the upper unit and the printed circuit board assembly for preventing relative horizontal movement therebetween; and fourth alignment means between the fixed base and the moveable base for preventing relative horizontal movement therebetween.

13. The assembly as described in claim 12, further including fifth alignment means between the upper unit and the support plate for preventing relative horizontal movement therebetween.

14. The assembly as described in claim 13, wherein said fifth alignment means acts upon the test plate and the support plate.

15. The assembly as described in claim 12, wherein pillars are located between said moveable base and said fixed base to respectively abut against said movable base and said fixed base.

16. The assembly as described in claim 12, wherein said printed circuit board assembly includes a printed circuit board and a reinforcement plate thereunder, and the second alignment means acts upon said reinforcement plate.

17. The assembly as described in claim 12, wherein said first alignment means further aligns the printed circuit board assembly for preventing relative horizontal movement thereof.

18. The assembly as described in claim 17, wherein said printed circuit board assembly includes a printed circuit board and a reinforcement plate thereunder, and both the first alignment means and the second alignment means act upon the reinforcement plate.

19. The assembly as described in claim 12, wherein a plurality of protrusions upwardly extend from the support plate for supporting the reinforcement plate.

20. The assembly as described in claim 12, wherein said second alignment means surrounds the printed circuit board assembly.

* * * * *